(12) United States Patent
Chlipala et al.

(10) Patent No.: US 8,180,600 B2
(45) Date of Patent: May 15, 2012

(54) INPUT/OUTPUT BUFFER INFORMATION SPECIFICATION (IBIS) MODEL GENERATION FOR MULTI-CHIP MODULES (MCM) AND SIMILAR DEVICES

(75) Inventors: James D. Chlipala, Emmaus, PA (US); Makeshwar Kothandaraman, Whitehall, PA (US); Nirav Patel, Bangalore (IN); Venu Babu Ummalaneni, Guntur (IN)

(73) Assignee: Agere Systems Inc., Allentown, PA (US)

( * ) Notice: Subject to any disclaimer, the term of this patent is extended or adjusted under 35 U.S.C. 154(b) by 914 days.

(21) Appl. No.: 11/469,028

(22) Filed: Aug. 31, 2006

(65) Prior Publication Data
US 2008/0059142 A1    Mar. 6, 2008

(51) Int. Cl.
G06F 7/60 (2006.01)
G06F 17/50 (2006.01)
(52) U.S. Cl. ............................................. 703/2; 716/101
(58) Field of Classification Search .......... 703/2; 716/6, 716/17
See application file for complete search history.

(56) References Cited

U.S. PATENT DOCUMENTS

| | | | |
|---|---|---|---|
| 6,212,490 B1 | 4/2001 | Li et al. | |
| 6,292,766 B1 * | 9/2001 | Mattos et al. | 703/14 |
| 6,425,109 B1 * | 7/2002 | Choukalos et al. | 716/119 |
| 6,915,249 B1 | 7/2005 | Sato et al. | |
| 6,993,740 B1 * | 1/2006 | Bergamaschi et al. | 324/762.06 |
| 7,143,023 B2 * | 11/2006 | Katz et al. | 706/16 |
| 2003/0083856 A1 | 5/2003 | Yoshimura et al. | |
| 2007/0250800 A1 * | 10/2007 | Keswick | 716/8 |

OTHER PUBLICATIONS

Roy Leventhal and Lynne Green, "Semiconductor Modeling for Simulating Signal, Power, and Electromagnetic Integrity", Chapter 8 "Selecting the Best Model for a Simulation", 2006, Springer, DOI 10.1007/b104647, ISBN 978-0-387-24159-3 (Print) 978-0-387-24160-9 (Online), p. 222.*
Synopsys Library Compiler, Reference Manual, vol. 1, Version 1998. 02, Feb. 1998, pp. 2-25, 2-29, 2-32, 2-33, 2-36, 2-45.*
IBIS Forum, I/O Buffer Modeling Cookbook, Revision 2.0X, Sep. 24 1997, p. 6.*
Synopsys, Liberty™, User Guide, vol. 1, Version 2003.12, Dec. 2003, pp. 4-69, 4-74.*
Synopsys, ModelTools Users Manual, R3.5a, Sep. 2000, pp. 36.*
Chip Express CX Technology Design Manual, DMCX2V005, Jun. 1998, Chip Express Corporation, p. GLO-2Glossary.*
Signature 1000M Cable Analyzer User's Guide, Version 4.0, Sep. 28, 1999, p. 53.*

(Continued)

Primary Examiner — Paul Rodriguez
Assistant Examiner — Juan Ochoa
(74) Attorney, Agent, or Firm — Mendelsohn, Drucker & Associates, P.C.; Edward J. Meisarosh; Steve Mendelsohn

(57) ABSTRACT

In one embodiment, the invention is a method for modeling electrical behavior of a packaged module having multiple integrated circuits (ICs), such as a multi-chip module (MCM). The method includes: (a) identifying one or more pin groups in the module, wherein a pin group comprises two or more buffers connected together and to a package-external pin, and (b) generating one or more corresponding unified behavioral models for the one or more pin groups based on the characteristics of the buffers of the one or more pin groups. The behavioral models are part of an integrated behavioral model file in accordance with the I/O buffer information specification (IBIS) standard.

23 Claims, 2 Drawing Sheets

OTHER PUBLICATIONS

"Buffer Issue Resolution Document (BIRD) 50.3 Add Submodel Bus Hold," IBIS Open Forum Jul. 17, 1998, [Retrieved on Aug. 24, 2006], Retrieved from the Internet: <URL:http://eda.org/pub/ibis/birds/bird50.3.txt> (3 pages).

"Bus Hold Circuit Standard and Linear Logic," Elihard Haseloff, Texas Instruments Application Report, SCLA015—Feb. 2001 (16 pages).

"Practical Issues with IBIS Models," Bob Ross, Interconnectix Unit of Mentor Graphics Corporation, [Retrieved on Aug. 16, 2006], Retrieved from the Internet: <URL:http://www.eigroup$_{13}$ org/ibis/pcbeas97.htm> (20 pages).

"I/O Buffer Modeling Spec Simplifies Simulation for High-Speed Systems," Derrick Duehren et al., Intel Corporation, Sep. 26, 1994, [Retrieved on Aug. 21, 2006], Retrieved from the Internet: <URL: http://www.eigroup.org/ibis/intel.htm>(12 pages).

"Simulating Altera Devices With IBIS Models," Altera Corporation, Application Note 283, Nov. 2003, ver. 1.1 Retrieved on Aug. 22, 2006] Retrieved from the Internet: <URL: http://www.altera.com/literature/an/an283.pdf>.

* cited by examiner

INPUT/OUTPUT BUFFER INFORMATION SPECIFICATION (IBIS) MODEL GENERATION FOR MULTI-CHIP MODULES (MCM) AND SIMILAR DEVICES

BACKGROUND OF THE INVENTION

1. Field of the Invention

The current invention relates to input/output buffer information specification (IBIS) model generation, and more particularly, to IBIS model generation for multi-chip modules (MCMs) and similar devices.

2. Description of the Related Art

Integrated circuit (IC) devices are electronic devices containing one or more semiconductor dies, or "chips." Chips have been successfully designed for decades using software known as electronic design automation (EDA) tools. To design an IC, a first "cut" of the design is done and then it is simulated to see how well the design works. The results are used by designer to correct any shortcomings in the design and the cycle is repeated until the desired results are obtained. The simulator uses a software model of the design, and different operating parameters are applied to the model, such as different clock speeds, signal inputs, temperature ranges, operating voltages, etc., to determine how well the design operates in a given application. One well-known model is referred to as a SPICE (Simulation Program with Integrated Circuits Emphasis) model, which relies on detailed design and component information. A SPICE model can allow accurate but slow simulation of the chip. However, the information needed for the model is considered proprietary by the manufacturer of the chip and may not be shared freely with customers.

To simplify system designs and to satisfy the desire for more functionality in smaller packages, a new kind of device, known as a multi-chip module (MCM) has been developed. An MCM has multiple chips mounted on a substrate, such as a printed circuit board (PCB), and encapsulated together to form a single packaged device. One example of an MCM is a system-in-a-package (SiP) device, wherein one module performs many or even all of the electronic functions of an electronic system. The chips in an MCM may be connected to each other as well as to external pins of the MCM package. In some cases, one or more package-external pins are connected to multiple input/output (I/O) buffers located on multiple chips. And as the clock speed of chips increases, the behavior of interface circuitry (e.g., I/O buffers) on the chips and the wiring between the chips become critical for proper operation.

Timing, transmission-line effects, and power considerations must be considered by system designers to get a reliable system. The modeling, analysis and correction of these effects is generally known as signal integrity (SI) analysis. To determine if the chips are correctly interfaced, a signal integrity (SI) analyst models the interconnected chips. Because of the complexity of the SPICE models for the individual chips, simulating the interconnected chips can be impractically slow and unwieldy, assuming that the individual SPICE models are made available by the manufacturer.

Alternatively, modeling multiple chips interconnected together allows a chip designer to modify the interface circuitry on one or more of the chips prior to final design so that the chips work better together. In this example, the bottleneck in the design cycle is the same for the chip designer as it is for the system designer: having the proper models to simulate the interconnected chips and that the simulation be fast enough to be practical.

An alternative to the detailed and propriety component-level SPICE model is a behavioral model of a device. A behavioral model treats the device as a black box and describes how its buffers and/or pins interact with the outside world without disclosing the device's detailed design and component information. For example, a behavioral model can provide current vs. voltage (I/V) information for different operational modes of the pins of a device. A behavioral model generally allows for faster simulation of device interaction than does a SPICE model of the equivalent device.

A widely-used behavioral simulation standard for IC devices is defined by the input/output (I/O) buffer information specification (IBIS), also known as ANSI/EIA-656, and is incorporated herein by reference in its entirety. IBIS has been evolving since version 1.0 was introduced in 1993. An example of an IBIS modeling tool, or modeler, can be found in the Hyperlynx suite of EDA tools from Mentor Graphics Corp., of Wilsonville, Oreg. IBIS model files are formatted as human-readable ASCII text files which can be parsed by appropriate software. The information in IBIS model files includes I/V characteristics for each pin, rise and fall time characteristics for each pin, and information about the package of the device. The I/V characteristics reflect many non-linear aspects of an I/O buffer design, such as diodes for electro-static discharge (ESD) protection, and pull-up and pull-down transistor characteristics. The information in an IBIS model file may be: (i) derived from a SPICE, or similar, model, by conversion or simulation of the model, (ii) obtained empirically by measurement, or (iii) obtained by a combination of both.

An IBIS model file uses keywords in brackets, such as [Component], [Package], [Pin], and [Model], followed by textual information describing the keyword item. For example, the [Component] keyword is followed by the name of the device (i.e., an identifier for the IC) that is modeled in the file, while the [Package] keyword is followed by default values for the resistance, inductance, and capacitance of the bond wire and pin combination of the device package, wherein the values are represented by the R_pkg, L_pkg, and C_pkg parameters, respectively. Where appropriate and available, three values are provided for parameters and/or sub-parameters: typical, minimum, and maximum values. In accordance with the present standard, if values are not available, then the reserved word "NA" is used.

The [Pin] keyword is followed by a listing of all the pins of the device, including, for each pin, the name of the associated signal path, the name of the associated I/V model, and pin-specific package-related resistance, inductance, and capacitance information, which are represented by the R_pin, L_pin, and C_pin parameters, respectively.

The [Model] keyword is followed by information for a particular I/V model, including: (i) the output capacitance, represented by the C_comp parameter, (ii) I/V data for pull-down, pull-up, ground-clamp diode, and power-clamp diode, which appears following the [Pulldown], [Pullup], [GND_clamp], and [POWER_clamp] keywords, respectively, to the extent the blocks are present in the device, and (iii) the ramp time for rising and falling transitions of the pull-up and pull-down structures, which are represented under the [Ramp] keyword by the dV/dt_r and dV/dt_f parameters, respectively. If more detailed information is desired for transitions between logic states represented by the pull-up and pull-down structures, voltage versus time (V/T) data can be provided for the rising and falling waveforms, under the [Rising Waveform] and [Falling Waveform] keywords, respectively. Multiple rising and falling waveform tables may be provided to account for multiple load types.

If a buffer does not include clamp-diodes, the corresponding keywords (i.e., [GND_clamp] and [Power_clamp]) and their respective data may be omitted from the corresponding model. The clamp-diode characteristics are meant to be modeled in parallel with the output transistor characteristics so that the clamp-diode characteristics are present even when the output buffer is off (i.e., in a high-impedance state). The I/V data includes a range of voltage values, and for each voltage value, values for the typical, minimum, and maximum corresponding current. In accordance with the IBIS standard, voltages in the pull-up and power-clamp sections are relative to Vcc, a power supply voltage, i.e., the voltage shown is equal to Vcc minus the output voltage, which may measured or derived. A particular I/V model in an IBIS model file may apply to any number of the pins of the modeled device.

FIG. 1 shows a schematic representation 100 of the basic elements of an IBIS model for an exemplary CMOS I/O buffer. It should be noted that the invention is not limited to CMOS technology and applies to other semiconductor technologies, such as bipolar technology. Within an IBIS model file, the model for a particular pin may be referenced by the [Pin] keyword and defined under the [Model] keyword. The basic elements of an IBIS model are represented by the numbered blocks in FIG. 1. Block 1 contains pull-down output transistor 101, modeled in an IBIS model file by the I/V data under the [Pulldown] keyword, describing characteristics of the buffer when driven low. Block 2 contains pull-up output transistor 102, modeled by the I/V data under the [Pullup] keyword, describing characteristics of the buffer when driven high. Block 3 contains ESD-protection diodes 103 and 104, modeled by the I/V data under the [GND_clamp] and [Power_clamp] keywords, respectively. Block 4 refers to the transition time of the output as it switches from one logic state to another, modeled under the [Ramp] keyword. Block 4 may be used for modeling the AC behavior of the pin. Block 5 represents parasitics (resistance, inductance, and/or capacitance) of the semiconductor die and the package, modeled under the [Package], [Pin], and/or [Model] keywords.

I/O (i.e., bi-directional) and output-only buffers models include all five blocks of FIG. 1. Input-only buffer models, however, may only need blocks 3 and 5 as they do not contain any output transistors. Thus, IBIS models for pins that serve input-only buffers typically do not include I/V information for pull-up elements, pull-down elements, and ramp time, and do not include the associated keywords (i.e., [Pullup], [Pulldown], and [Ramp]).

FIG. 2 shows a simplified diagram of MCM 200 containing four semiconductor dies, specifically, chips 201, 202, 203, and 204, each having a buffer connected to package-external pin 205, namely, buffers 206, 207, 208, and 209, respectively. Since previously-extant behavioral-modeling standards, such as IBIS, do not provide a satisfactory methodology for modeling and simulating system designs such MCMs, a new approach to modeling multiple-chip embodiments is needed.

SUMMARY OF THE INVENTION

One embodiment of the invention is a method for modeling electrical behavior of a packaged module having multiple integrated circuits (ICs), the method comprising: (a) identifying one or more pin groups in the module, wherein a pin group comprises two or more buffers connected together and to a package-external pin, and (b) generating one or more corresponding unified behavioral models for the one or more pin groups based on the characteristics of the buffers of the one or more pin groups.

Another embodiment of the invention is a machine-readable medium, having encoded thereon program code, wherein, when the program code is executed by a machine, the machine implements a method comprising: (a) identifying one or more pin groups in a packaged module having multiple ICs, wherein a pin group comprises two or more buffers connected together and to a package-external pin, and (b) generating one or more corresponding unified behavioral models for the one or more pin groups based on the characteristics of the buffers of the one or more pin groups.

Yet another embodiment of the invention is a method for modeling electrical behavior of a packaged module having multiple integrated circuits (ICs), the method comprising: (a) identifying one or more pin groups in the module, wherein a pin group comprises two or more buffers coupled together and to a package-external pin, and (b) generating one or more corresponding unified behavioral models for the one or more pin groups based on the characteristics of the buffers of the one or more pin groups.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
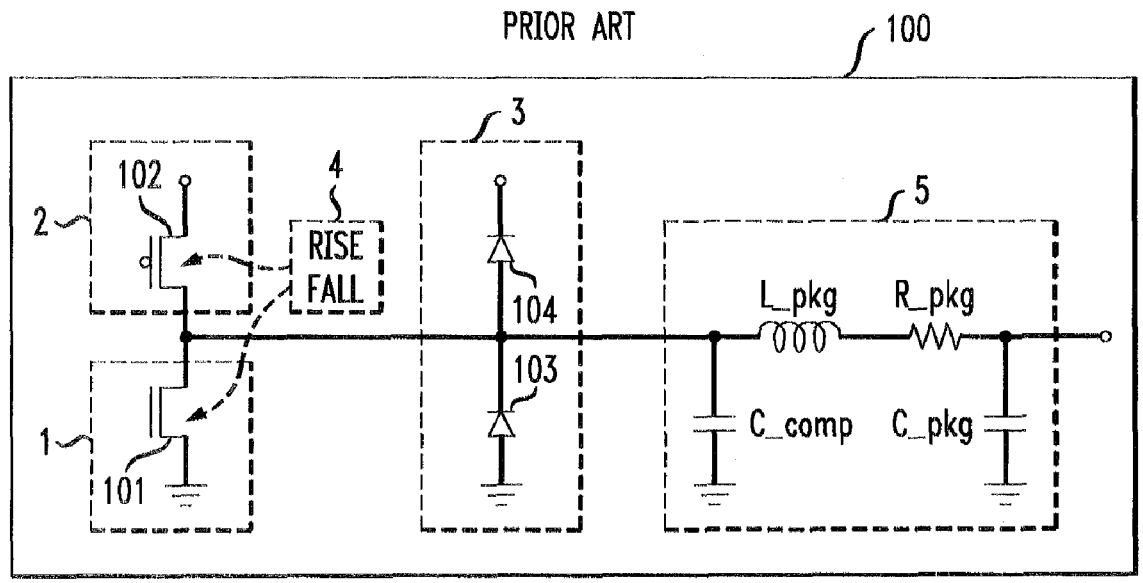
FIG. 1 shows a schematic representation of basic elements of an IBIS model for a sample buffer.
Figure 2:
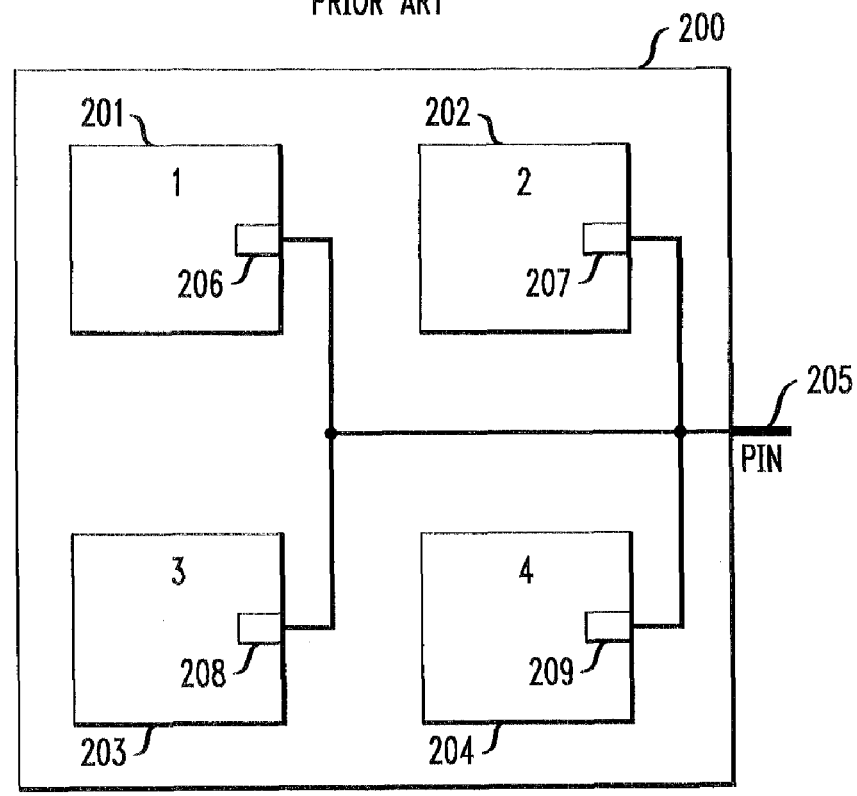
FIG. 2 shows a simplified diagram of an MCM in accordance with an embodiment of the present invention.

In accordance with an embodiment of the present invention, a single unified IBIS model file is generated for MCM 200. Pin 205 and buffers 206, 207, 208, and 209 together form a pin group. In FIG. 2 only one pin group is shown for MCM 200. However, an MCM can contain any number of pin groups, each comprising any number of buffers connected to a single pin. It should be noted that the present invention applies equally well to embodiments where multiple buffers are connected to a package-external pin, wherein that pin is directly connected to one or more additional pins, as the directly connected pins behave essentially as a single pin. The modeling process is the same for each pin group, though the resultant models are likely to differ, based on the particular architecture of each pin group. The modeling process involves generating a model for each buffer of a pin group as though that buffer were the only buffer connected to the external pin, and then adjusting the data values in that model based on the models for the other buffers. Alternatively, the adjustments can be made on-the-fly by the simulator as it performs simulations for the pin of the pin group. The adjustments are simpler if all the buffers in a group are equivalent.

Figure 3:
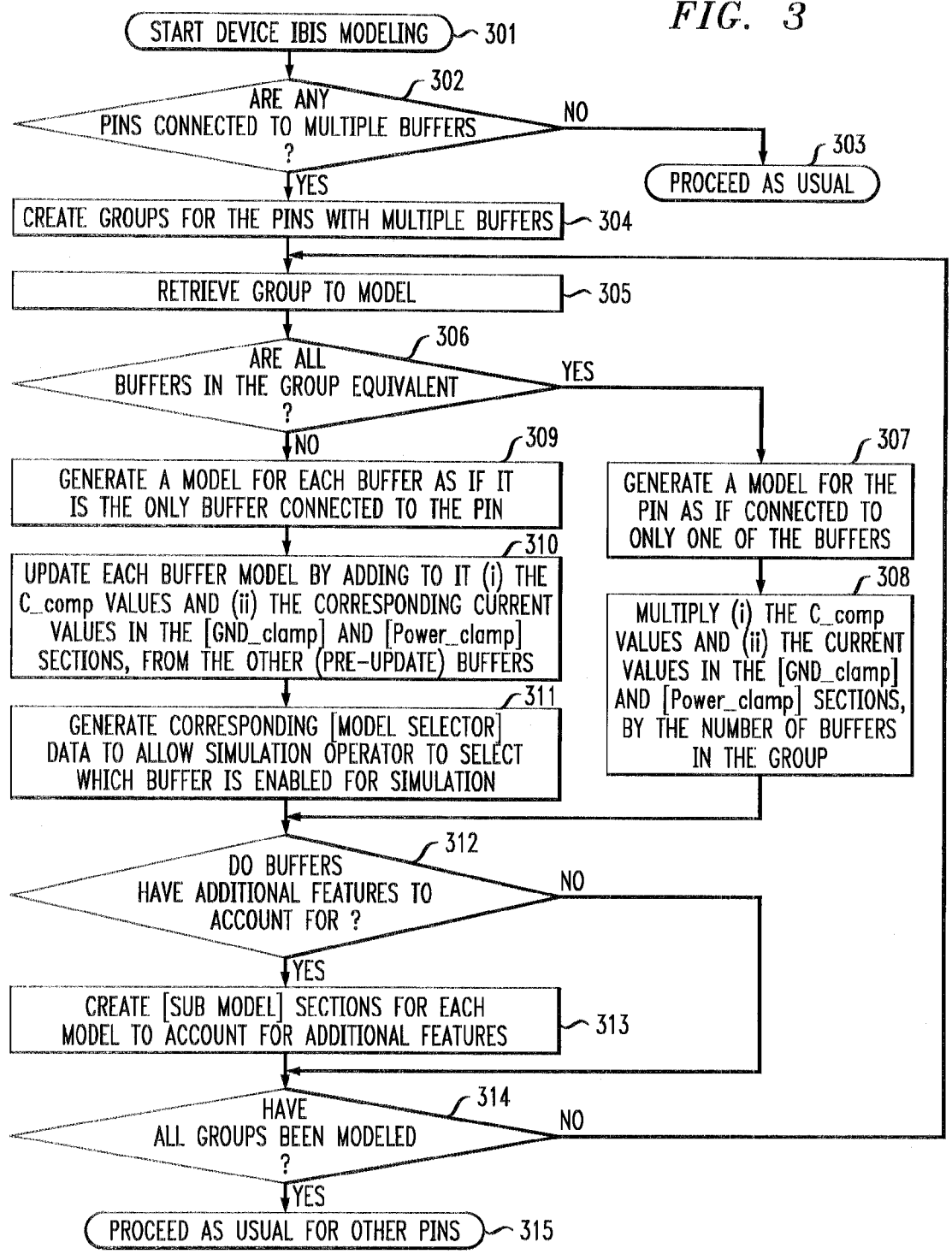
FIG. 3 shows a flow chart for a method of behavioral modeling in accordance with one embodiment of the present invention.

FIG. 3 shows a flowchart for modeling an MCM in accordance with an embodiment of the present invention. Modeling is typically performed by a computer or similar automated device, although it may also be performed manually. After IBIS modeling of the target device is initiated (step 301), it is determined whether the target device has any pins that are connected to multiple buffers (step 302). If it is determined that the target device has no pins connected to multiple buffers (step 302), then IBIS modeling proceeds as usual (i.e., as is known in the art) (step 303). If it is determined that the target device does have one or more pins connected to multiple (i.e., two or more) buffers, then the pins and buffers are organized into pin groups (step 304), wherein each pin group comprises a pin and the multiple buffers connected to the pin. Each pin group is then modeled.

After a pin group is retrieved (step 305), it is determined whether all the buffers in the pin group are behaviorally equivalent (step 306). If it is determined that all the buffers in the pin group are behaviorally equivalent (step 306), then a model is generated for the pin as though the pin were connected to only one of the buffers (step 307). That model is then modified to account for the multiplicity of buffers in the pin group by replacing (i) the C_comp value by that value multiplied by the number of buffers in the pin group, and (ii) the current values in the [GND_clamp] and [Power_clamp] sections by those values multiplied by the number of buffers in the pin group (step 308).

If it is determined that the buffers in the pin group are not all behaviorally equivalent (step 306), then a model is generated for each buffer as if it were the only buffer connected to the pin (step 309). Each of those buffer models is then updated by (i) adding, to the C_comp value, the C_comp values from the other buffers of the pin group (using pre-update values), and (ii) adding, to the current values in the [GND_clamp] and [Power_clamp] sections, the corresponding current values from the other buffers of the pin group (using pre-update values) (step 310). The C_comp, ground-clamp, and power-clamp values of the other buffers are added to the values of the buffer being modeled because those values represent the behavior of buffer components whose effects are present whether their containing buffer is active or inactive. In an alternative embodiment, the process adds other values that represent effects that are present regardless of the state of the buffer.

Appropriate [Model Selector] data is generated and added to the model file to allow a simulator and/or simulation operator to select which buffer of the buffer group is enabled for a particular simulation (step 311). It should be noted that steps 309-311 can also be used if the buffers in a pin group are behaviorally equivalent, but following steps 307-308 in that situation should be faster, produce a smaller model file, and allow for faster simulation due to the smaller file size and reduced need for buffer model selection. Both procedural pathways can be used because the situation where the buffers in a pin group are behaviorally equivalent is a special case of the general situation where the buffers are not necessarily behaviorally equivalent.

Additional adjustments to a model may be necessary if the buffers in the pin group have additional features, such as, for example, bus-hold functionality. Bus-hold mode is a data-latching mode that allows a buffer to maintain its previous value, but at a lower current draw than in regular output mode. The IBIS standard provides a [Submodel] keyword and Submodel_type parameter for modeling a single buffer with bus-hold functionality. The original model for that buffer becomes known as the parent model, while the sub-model contains data for representing the bus-hold functionality for that buffer. The information in the sub-model is used by a simulator in conjunction with information in the parent model to model bus-hold mode behavior. The relationship between the parent model and the bus-hold sub-model is dynamic, thus, typically, a single unified model is not created to represent bus-hold functionality as such a unified model would likely be excessively large.

After the basic models have been created for the buffers of the pin group (steps 307-308, or 309-311), it is determined whether the buffers have additional features that need to be accounted for in the model file (step 312). Bus-hold functionality is an example of such an additional feature. If it is determined that the buffers have such additional features (step 312), then one or more sub-models, designated by a [Submodel] keyword, are generated to account for those features, and appropriate parameter directives are added to provide direction to a simulator on application of the sub-models (step 313). One such parameter is the [Add submodel] keyword, which is used to direct the simulator to add the data values of one or more sub-models to the corresponding values of the parent model, rather than substituting the sub-model values for the parent model values.

If it is determined that the buffers do not have additional features that need to be accounted for (step 312), then it is determined whether all the pin groups identified have been modeled (step 315), which is also performed following the sub-model generation of step 314. If it is determined that all the pin groups have been modeled (step 314), then the usual modeling is performed on any remaining pins that were not in pin groups (315). If it is determined that not all of the pin groups have been modeled (step 314), then the procedure returns to step 305 to get the next pin group to model.

The generated model file can then be used by a simulator with varying degrees of automation, as determined by the particular simulator program and/or the simulator program operator, e.g., an SI analyst. Regardless of the level of automation chosen, the generated model file conveniently allows the operator a range of simulation possibilities heretofore unavailable or impractical.

Referring to FIG. 2, if (i) buffers 206, 207, 208, and 209 are behaviorally-identical buffers, and (ii) when any buffer is in output mode, the other three buffers are disabled, then a single model can be used to model the behavior of pin 205. Since the buffers are behaviorally identical, i.e., they have identical behavioral models, any of the buffers can be used to generate the model. The modeling process, as described above, will generate a model providing, among other values, a C_comp value, and I/V tables for pull-up, pull-down, ground-clamp, and power-clamp elements. As noted above, if the buffers are input-only buffers, then pull-up and pull-down sections are not applicable. The C_comp value is then multiplied by the number of buffers in the group, i.e., four, to account for the other buffers. The current values in the I/V tables for pull-up and pull-down are multiplied by the number of buffers in the group, i.e., four, to account for the other buffers. The now-adjusted model for pin 205, of the IBIS model file for MCM 200, represents the behavior of pin 205 and may be used in simulating the behavior of pin 205.

In accordance with an embodiment of the present invention, if buffers 206, 207, 208, and 209 have bus-hold functionality, then corresponding sub-models are generated. Appropriate parameter values can be added to the model file to direct the simulator to correctly use the model and sub-model data, as would be appreciated by one of ordinary skill in the art. The simulator can then use the model file to dynamically generate simulations for pin 205, depending on the particular parameters set for the simulation by the simulation operator, such as, for example, the operational modes of each of the buffers.

Although embodiments of the present invention have been described using the IBIS modeling standard, any suitable behavioral modeling format may be used. For example, an IBIS data file may be converted, relatively easily, into another standard textual data format, such as extensible mark-up language (XML) format. Or a behavioral model can be created initially in a different format, such as XML. As further example, behavioral modeling data may be stored in a database, either proprietary or open.

The terms "connect," "connected," or "connection" as used herein refer to a linking that allows the transmission of signals. The transmission (1) may be through one or more media, (2) may be either unidirectional or bidirectional, and (3) may be direct or indirect, in which case the linking includes one or more intermediary devices. For example, transmission may take place via electrically conductive elements, radio-frequency (RF) wireless signals, infra-red (IR) wireless signals, optical fibers, capacitive coupling, magnetic coupling, or any other suitable means of signal transmission.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium or loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. A computer-implemented method for modeling electrical behavior of a first external pin of a packaged multi-chip module, wherein:
   the module further comprises multiple integrated circuits (ICs) packaged together, each IC having one or more input/output (I/O) buffers, wherein the first external pin is connected to at least (i) a first I/O buffer of a first IC and (ii) a first I/O buffer of a second IC, to form a pin group;
   the method comprises:
   (a) obtaining characteristics of the first I/O buffer of the first IC;
   (b) obtaining characteristics of the first I/O buffer of the second IC; and
   (c) generating a corresponding unified behavioral model for the first external pin based on the characteristics of the first I/O buffers of the first and second ICs.

2. The method of claim 1, wherein:
   (i) obtaining characteristics of the I/O buffers comprises generating a behavioral model for each I/O buffer of the pin group, each model having values associated therewith; and
   (ii) generating the corresponding unified behavioral model comprises modifying the behavioral model for each I/O buffer of the pin group based on the behavioral models of the other I/O buffers of the pin group.

3. The method of claim 2, wherein the modifying step comprises adding, to one or more values of the behavioral model of the first I/O buffer of the first IC, the corresponding values of the behavioral models of the other I/O buffers of the pin group.

4. The method of claim 3, wherein the one or more values of the behavioral model of the first I/O buffer of the first IC comprise component capacitance and current values of a voltage versus current table.

5. The method of claim 2, wherein the modifying step is performed by a computer-implemented simulator.

6. The method of claim 2, wherein:
   the modifying step is performed by a computer-implemented modeler; and
   the modified values are stored in a behavioral model file generated by the modeler.

7. The method of claim 2, wherein modifying the behavioral model comprises modifying one or more values in the behavioral model for the each I/O buffer, the modified values representing elements of other I/O buffers of the pin group whose effects are present regardless of the state of the other I/O buffers of the pin group.

8. The method of claim 2, wherein the behavioral models modified in step (ii) were generated in step (i).

9. The method of claim 1, wherein the unified behavioral model is part of an integrated behavioral model file adapted to be used by a computer-implemented simulator for simulating the electrical behavior of the module.

10. The method of claim 9, wherein the behavioral model file conforms to the I/O buffer information specification (IBIS) standard.

11. The method of claim 1, wherein the generating step further comprises generating behavioral sub-models to account for additional features of one or more of the I/O buffers of the pin group.

12. The method of claim 11, wherein the additional features comprise bus-hold functionality.

13. The method of claim 12, wherein bus-hold functionality comprises having a data-latching mode that allows a buffer to maintain its previous value, but at a lower current draw than in a regular output mode.

14. The method of claim 11, wherein the step of generating behavioral sub-models further comprises generating one or more directives for a simulator for using the sub-models with the model section.

15. The method of claim 1, wherein:
all the I/O buffers of the pin group are behaviorally equivalent;
steps (a) and (b) comprise obtaining a behavioral model for any I/O buffer of the pin group; and
step (c) comprises modifying one or more values of the behavioral model by multiplying the one or more values by the number of I/O buffers in the pin group.

16. The method of claim 15, wherein the one or more values of the behavioral model comprise component capacitance and current values of a voltage versus current table.

17. The method of claim 15, wherein the modifying step is performed by a computer-implemented simulator.

18. The method of claim 15, wherein:
the multiplying step is performed by a computer-implemented modeler; and
the multiplied values are stored in a behavioral model file generated by the modeler.

19. The method of claim 1, wherein the unified behavioral model is usable to model the behavior of the first external pin.

20. The method of claim 1, wherein:
the characteristics of the first I/O buffer of the first IC are represented by a first behavioral model for the first I/O buffer of the first IC;
the characteristics of the first I/O buffer of the second IC are represented by a second behavioral model for the first I/O buffer of the second IC; and
step (c) comprises generating the unified behavioral model for the first external pin using the first and second behavioral models.

21. The method of claim 20, wherein the steps of (a) obtaining characteristics of the first I/O buffer of the first IC and (c) generating the unified behavioral model, are performed without accessing detailed design and component information of the first IC.

22. A non-transitory machine-readable medium, having encoded thereon program code, wherein, when the program code is executed by a machine, the machine implements a method for modeling electrical behavior of a first external pin of a packaged multi-chip module, wherein the module further comprises multiple integrated circuits (ICs) packaged together, each IC having one or more input/output (I/O) buffers, wherein the first external pin is connected to at least (i) a first I/O buffer of a first IC and (ii) a first I/O buffer of a second IC, to form a pin group, the method comprising:
(a) obtaining characteristics of the first I/O buffer of the first IC
(b) obtaining characteristics of the first I/O buffer of the second IC; and
(c) generating a corresponding unified behavioral model for the first external pin based on the characteristics of the first I/O buffers of the first and second ICs.

23. An apparatus for modeling electrical behavior of a first external pin of a packaged multi-chip module, wherein the module further comprises multiple integrated circuits (ICs) packaged together, each IC having one or more input/output (I/O) buffers, wherein the first external pin is connect to at least (i) a first I/O buffer of a first IC and (ii) a first I/O buffer of a second IC, to form a pin group, the apparatus comprising:
(a) means for obtaining behavioral characteristics of the first I/O buffer of the first IC;
(b) means for obtaining behavioral characteristics of the first I/O buffer of the second IC; and
(c) means for generating a corresponding unified behavioral model for the first external pin based on the characteristics of the first I/O buffers of the first and second ICs.

* * * * *